United States Patent

Zhang et al.

[11] Patent Number: 5,966,709
[45] Date of Patent: Oct. 12, 1999

[54] METHOD OF OPTIMIZING AN N-GRAM MEMORY STRUCTURE

[75] Inventors: Tao Zhang, Ann Arbor; Joseph M. Bugajski, Ypsilanti; K. R. Raghavan, Canton, all of Mich.

[73] Assignee: Triada, Ltd., Ann Arbor, Mich.

[21] Appl. No.: 08/939,023

[22] Filed: Sep. 26, 1997

[51] Int. Cl.$^6$ .................................................. G06F 17/30
[52] U.S. Cl. .................................................. 707/101; 707/3
[58] Field of Search .................................... 707/3, 5, 101

[56] References Cited

U.S. PATENT DOCUMENTS

| | | | |
|---|---|---|---|
| 4,853,696 | 8/1989 | Mukherjee | 341/65 |
| 5,245,337 | 9/1993 | Bugajski et al. | 341/51 |
| 5,274,805 | 12/1993 | Fergurson et al. | 707/7 |
| 5,293,164 | 3/1994 | Bugajski | 341/581 |
| 5,533,148 | 7/1996 | Sayah et al. | 382/240 |
| 5,592,667 | 1/1997 | Bugajski | 395/613 |
| 5,694,591 | 12/1997 | Du et al. | 707/2 |
| 5,781,906 | 7/1998 | Aggarwal et al. | 707/102 |

*Primary Examiner*—Paul R. Lintz
*Assistant Examiner*—Jean Bolte Fleurantin
*Attorney, Agent, or Firm*—Gifford, Krass, Groh, Sprinkle, Anderson & Citkowski, PC

[57] ABSTRACT

By placing a low cardinality node or a leaf in a lower level, and a high cardinality node or a leaf at a higher level, an optimal memory structure is automatically generated which yields the best compression within N-gram technology. After making an initial list of parallel streams or fields, the streams are ordered in accordance with increasing cardinality. Adjacent streams (fields), or nodes, are paired, and the children of the resulting node are eliminated from the list, while a new parent node is added to the list. The resulting new list is re-arranged from right to left as a function of increasing cardinality, and the pairing steps are repeated until a single root node is remains for the final memory structure.

10 Claims, 5 Drawing Sheets

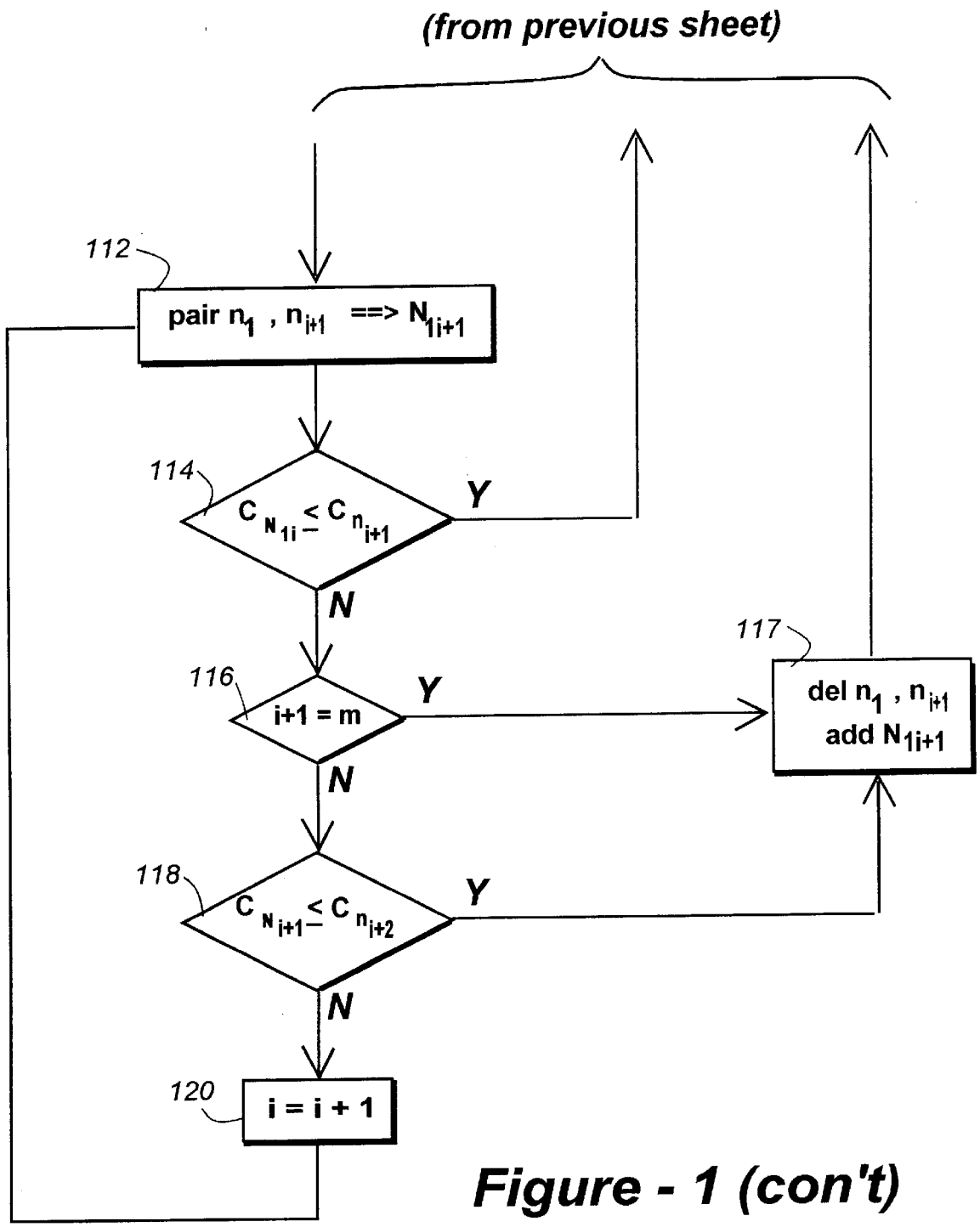
*Figure - 1 (con't)*

```
               last-name (L)     middle-name (M)     zip-code (Z)    city (C)
                   1084                840               620           409

1)         L - 1084            M - 840           Z - 620         C - 409
                                                            \       /
                                                             \     /
                                                             ZC - 817

2)         L - 1084        M - 840         ZC - 817
                       \        /    \         /
                        \      /      \       /
                       LZC - 4383    MZC - 5432

ROOT - 8554
                                                                  /        \
    3)       LZC - 4383    MZC - 5432              LZC - 4383              M - 840
                     \      /                      /       \
                      \    /                    L - 1084    \
                    ROOT - 8554                              C - 409
                                                            Z - 620
```

Figure - 2

| | | |
|---|---|---|
| ✓ | 0-1 | 476 |
| | 0-2 | 1173 |
| | 1-1 | 32844 |
| ✓ | 1-2 | 12972 |
| | 1-3 | 21735 |
| ✓ | 2-1 | 2176 |
| | 2-2 | 2380 |
| | 3-1 | 1867 |
| | 4-1 | 2380 |
| | 5-1 | 32844 |

| | | | | | |
|---|---|---|---|---|---|
| ✓ 0-1 | 29 | 5-1 | 12033 | ✓ 10-1 | 233556 |
| 0-2 | >29 | ✓ 5-2 | 9387 | 10-2 | >233556 |
| 1-1 | 293 | 5-3 | >9387 | 11-1 | 394351 |
| 1-2 | 178 | ✓ 6-1 | 12078 | ✓ 11-2 | 378152 |
| ✓ 1-3 | 36 | 6-2 | >12078 | 11-3 | >378152 |
| ✓ 2-1 | 170 | ✓ 7-1 | 29881 | 12-1 | 385909 |
| 3-1 | 497 | ✓ 8-1 | 113170 | ✓ 12-2 | 319241 |
| ✓ 3-2 | 154 | 8-2 | >113870 | ✓ 13-1 | 397885 |
| 4-1 | 1550 | 9-1 | 302783 | 13-2 | >397885 |
| ✓ 4-2 | 1512 | ✓ 9-2 | 89522 | ✓ 14-1 | 399649 |
| 4-3 | >1512 | 9-3 | >89522 | ✓ 15-1 | 400000 |

METHOD OF OPTIMIZING AN N-GRAM MEMORY STRUCTURE

FIELD OF THE INVENTION

This invention relates generally to data compression of the type wherein an input data body is converted into an ordered data structure and, in particular, to a method of analyzing the cardinality of the input data body for the purpose of optimizing the structure.

BACKGROUND OF THE INVENTION

This invention resides in certain improvements to subject matter set forth in commonly assigned U.S. Pat. Nos. 5,245,337 and 5,293,164, both of which are entitled DATA COMPRESSION WITH PIPELINE PROCESSOR HAVING SEPARATE MEMORIES, and U.S. Pat. No. 5,592,677, entitled METHOD OF STORING COMPRESSED DATA FOR ACCELERATED INTERROGATION.

The first two patents describe a general system for implementing a loss-less compression technique with superior compression ratios. The method described there was fast and the storage scheme for the transformed data permitted efficient and fast searches to be performed. The effective search on the transformed data was the subject of U.S. Pat. No. 5,592,667, where queries could be solved on the compressed data itself, without the need to decompress the data first. The NGRAM transform is unique in that the data itself forms the index, and the high compression ratio means that input-output rates are no longer the bottle neck in solving queries.

The raw input data consisting of M parallel streams, are basically transformed into a multi-level n-ary memory structure (also called memory structures) as described in U.S. Pat. Nos. 5,245,337 and 5,293,164. The memory structure will have at most M leaf nodes, where a leaf node is defined as a node with no children.

Each leaf node consists of the unique values that occur in that stream, along with a count of the number of repeated occurrences of that value. The total number of unique values (also called memories) that occurs is defined as the cardinality of that node. Similarly, each non-leaf node of the memory structure, consisting of n children (leaf or non-leaf) nodes, stores the unique combination of the n events of its children. In other words, as the raw data stream progress from the bottom to the top of the memory structure, each leaf node corresponds to the unique values in the M streams and each n-ary node stores the various combinations of the n streams that are the children of that node.

Clearly, when multiple streams of data have to be combined as described above to form an NGRAM hierarchical memory structure, the topology of the memory structure is not unique. It is therefore meaningful to talk about an optimum/best memory structure topology for the memory structure. In order to do that, an optimality criterion must be specified. The technique discussed in this submission will optimize the memory structures for maximum compression Since non-terminal nodes with more than 2 children require a more complicated storage scheme, and because the storage scheme will have a direct impact on search times, the algorithm presented here considers the case of a strictly binary memory structure; i.e. n=2.

SUMMARY OF THE INVENTION

The fundamental idea behind the optimization can be understood by interpreting the meaning of each non-terminal node in the n-ary memory structure. In the case of a binary structure, each interior node of the NGRAM memory structure stores the unique combination of the joint events of its two children. Therefore, the size of an interior node is minimized when the number of unique combinations (patterns) of events that the node represents (by definition—the cardinality of the node) is minimized. Note that each terminal (leaf) node is already maximally compressed, since they represent unique occurrences of single (as opposed to binary events for non-terminal nodes) events in the data stream. It follows that the entire memory structure has minimum size when the sum of the cardinalities of all the nodes in the memory structure is minimized. Note that it is possible to use other metrics according to the invention as an optimality criterion to produce (possibly) different tree structures. For instance, the entropy of the node can be used to minimize the size of the node, with the overall memory structure having minimum entropy. Correlation coefficients and mutual information may alternatively be utilized.

The problem is complicated by the fact that in order to find the most compact representation of the memory structures, across all possible combinations of nodes, leads to combinatorial explosion. Hence, any naive search for the best structure from among all possible combinations requires an exhaustive consumption of computing resources. It is therefore unrealistic to expect such a naive search to find the optimal topology for anything other than small values of M. Thus, there is a need for an efficient technique that achieves this optimality while using reasonable computing resources.

The present invention provides a method for automatically determining the optimum multi-level memory structure(s), to maximize compression, within an NGRAM environment. Using cardinality as the optimality criterion, the method places a low cardinality node or a leaf at lower levels, while placing a high cardinality node or a leaf at higher levels in the memory structure. The leaf nodes of the memory structure are first built by processing the raw data as described in U.S. Pat. Nos. 5,245,337 and 5,293,164. The streams which are to be optimized into a memory structure, are then placed in a list in order of increasing cardinality, from right to left (i.e. the smallest cardinalities are found at the right of the list). Beginning at the right, the first stream (field/node) is paired with a stream (field/node) on the immediate left with the next smallest cardinality to form a parent node. The children of the resulting parent node are eliminated from the list, while the new parent node is added to the list. The resulting new list is re-arranged from right to left as a function of increasing cardinality, and the pairing steps are repeated, recursively, from the right, until a single root node remains for the final structure or memory structure. Pattern optimization is performed implicitly in the above pairing procedure in a sub-list while topology optimization is carried out by repeatedly ordering the modified lists from right to left with respect to increasing cardinality.

In a preferred embodiment, optimized pairing is obtained by pairing the first leaf or node on the right with the one next to it on the left, with the result being paired with the next leaf or node on the left. The resulting two nodes are then compared and the process is repeated until first node exhibits reduced cardinality. This local optimization achieves the minimum variational difference between two neighboring nodes. A curve is made of cardinalities by pairing the right-end field or node in the list with each node or field on its left. In general the curve has high cardinality on the left and low cardinality on the right, and has minimum cardinality in the neighborhood of the right end.

BRIEF DESCRIPTION OF THE DRAWINGS

FIG. 2 is an example of the invention using four fields and 8554 records;

DETAILED DESCRIPTION OF THE INVENTION

Figure 1:
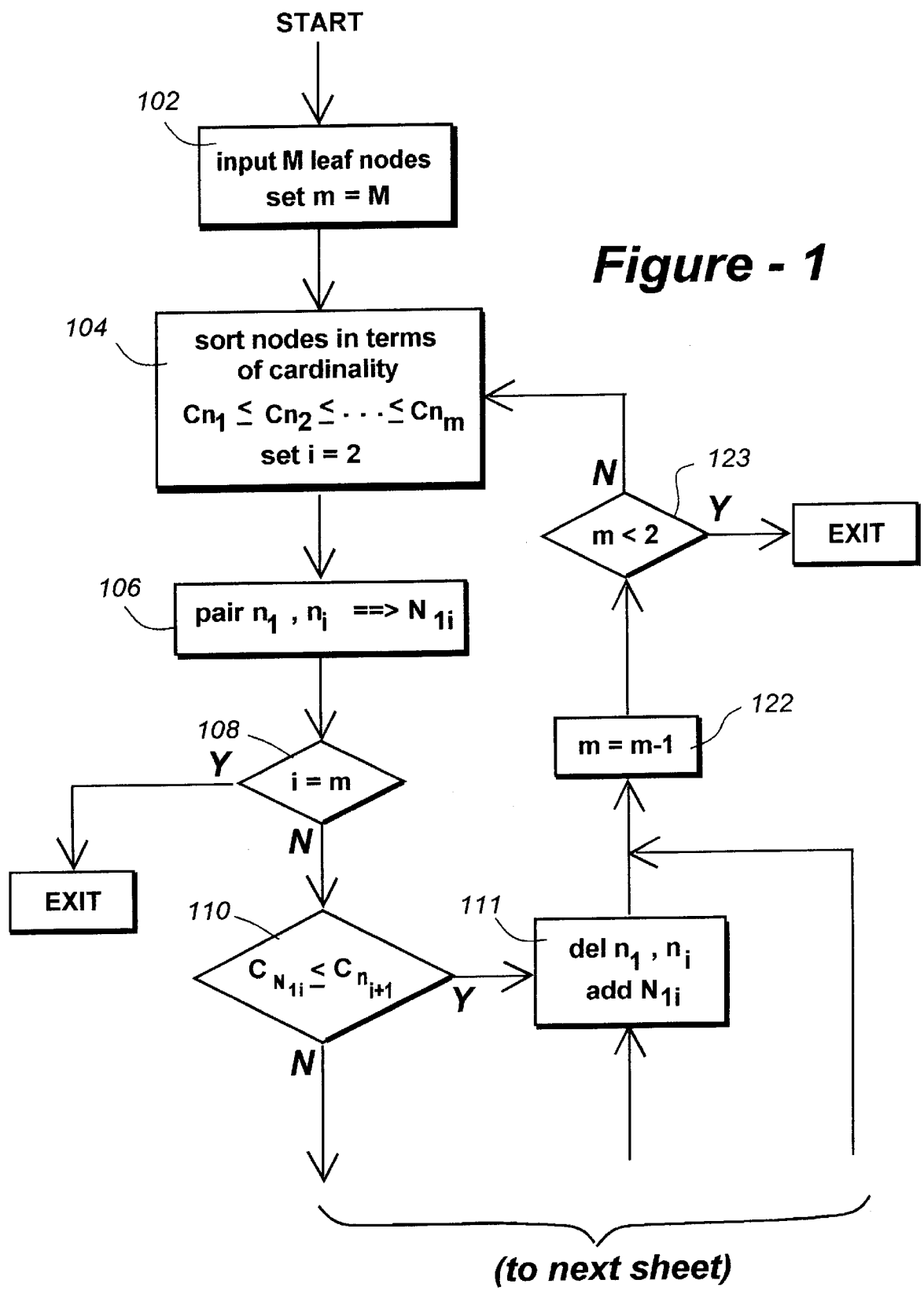
FIG. 1 represents, in the form of a flowchart, the overall method of the invention.

As discussed above in the Background, the present invention builds upon N-gram compression techniques disclosed in commonly assigned U.S. Pat. Nos. 5,245,337; 5,293,164; and 5,592,667, the entire contents of each of which is incorporated herein by reference.

The variational problem for a discrete system, such as an NGRAM memory structure representing a database, reduces to finding an optimal structure in which the nodes of the memory structure have the fewest number of memories. This is equivalent to finding the local minimum of the memory structure function, which represents the parent node cardinality as a function of its children nodes. This can be done by setting the partial difference of the memory structure function with respect to each individual node equal to zero. Recognizing that the amount of computing resources (memory, CPU, and disk) used to build an NGRAM memory structure is proportional to the total cardinality of the memory structure, minimizing the cardinality of each node would also minimize the computing resources used. When the local minimum is not unique (two pairs yielding the same cardinality), the algorithm arbitrarily picks out the first pair that has that cardinality. This may lead to some suboptimal structures because the cardinality at lower levels of the memory structures will affect the cardinality at higher levels, and consequently the entire memory structure itself Note however that finding the optimum structure in this case would, in the limit, be equivalent to an exhaustive search, and very expensive, if not impossible, to obtain.

The major concern for optimality in the case of database compression is to find an optimal NGRAM memory structure from among many possible combinations of patterns or memory structure topologies. For N parallel streams (fields or columns in a table), there are N−1 nodes in an N-gram memory structure. And, at a given level in an N-gram memory structure, there are only n−1 pattern combinations for the n nodes. The total number of pattern combinations is the multiple of the number of pattern combinations in all levels of the N-gram memory structure. For example, a symmetric N-gram memory structure consisting of 8 fields contains 7*5*3=105 total patterns. A symmetric memory structure of 16 fields contains 15*13*11*9*7*5*3=2,027,025 patterns. If one wants to find a particular pattern among 2 million different combinations, and one wants to determine a minimum total cardinality for any N-gram memory structure, one would use an infinite amount of CPU time during a naive exhaustive search for such pattern.

The problem of finding the optimal N-gram memory structure becomes more complicated when different N-gram memory structure topologies are taken into account. In this case, for each pattern, there can be a number of possible topologies. In particular, when N is even, the number of possible topologies is exactly:

$$n\_\{2N\}=n\_1*n\_\{2N\_1\}+n\_2*n\_\{2N-2\}+n\_3*n\_\{2N-3\}+\ldots+n\_\{N\}*n\_\{N\},$$

where $n\_1=n\_2=n\_3=1$, and $N=2,3,4,5\ldots$ Similarly, the number of possible topologies for 2N+1 (odd number of) fields is exactly:

$$n\_\{2N+1\}=n\_1*n\_\{2N\}+n\_2*n\_\{2N-1\}+n\_3*n\_\{2N-2\}+\ldots+n\_\{N+1\}*n\_\{N\}.$$

For example, if N=8, 9, and 10 fields, then there are, respectively, 24, 47, 103, distinct topologies. The total number of possible N-gram memory structures is obtained by multiplying the total number of possible patterns by the total number of different topologies.

The present invention builds upon discrete N-gram compression technology. In one embodiment, the method places a low cardinality node or a leaf in a lower level, while placing a high cardinality node or a leaf at a higher level. The procedure for finding the optimal structure is then as follows:

1. Make an initial list of parallel streams (fields);
2. Order the leaves of these streams from right to left according to increasing cardinality;
3. Beginning on the right, pair the first stream (field), or node, with a stream (field), or node, to its left;
4. Eliminate the children of this node from the list, and add the new parent node to the list;
5. Rearrange the resultant new list from right to left by increasing cardinality;
6. Reapply the steps 3 and 4, recursively, until a single root node remains for the resulting memory structure.

Pattern optimization is performed implicitly in the above optimization procedure in a sub-list while topology optimization is carried out by repeatedly ordering the modified lists right to left with respect to increasing cardinality.

In step 3, the optimized pairing is obtained in the following way:

Pair the first leaf or node on the right with the one next to it on the left.

Pair the first leaf with the next leaf or node on the left.

Compare the two nodes.

Stop pairing if the first node has less cardinality or keep the second node and continue to step (b) otherwise.

The above local optimization achieves the minimum variational difference between two neighboring nodes. A curve is made of cardinalities by pairing the right-end field or node in the list with each node or field on its left. In general, the curve has high cardinality on the left and low cardinality on the right, and has minimum cardinality in the neighborhood of the right end. The above local optimization obtains this cardinality in an efficient manner.

The entire procedure is depicted in FIG. 1, wherein Cni is the cardinality of node n-i; del n1, nj means delete nodes ni and nj from the list; add Ni means add a new parent mode, Ni, to the list; pair (ni,nj) ->N means pair two nodes nil and nj to form the parent node Nij.

Reference will be made to the flow diagram of FIG. 1 to illustrate examples of the method in use. Reference is made to FIG. 2, which illustrates an example having four fields and 8554 records. The fields are last name (L) having a cardinality of 1084; middle-name (M) having a cardinality of 841; zip-code (Z) having a cardinality of 620; and city (C) having a cardinality of 409. As shown in Step 1, the fields are first sorted in terms of cardinality with the greatest cardinality on the left in accordance with block 104 in FIG. 1. Next, the two rightmost nodes, Z and C, are paired, resulting in a cardinality ZC of 817 in accordance with block 106 of FIG. 1. As i is not equal to m, a query is made at block 110: is 817 less than 841, the cardinality of node M? Since the answer to this question is affirmative, the search for the first minimum node terminates, and nodes Z and C are deleted and replaced with node ZC in accordance with block 111 of FIG. 1. The value of m is decremented, and since it is not yet less than 2, the nodes are again resorted in accordance with block 104 as shown in Step 2 of FIG. 2, resulting in a sort, from left to right of 1084, 841, and 817.

The process described above is repeated, that is, nodes M and ZC are paired, which exhibits a cardinality MZC of 5432, and this is compared to the cardinality of node L. However, in this case, as 5432 is not less than 1084, the procedure drops down to block 112 in FIG. 1, causing nodes L and ZC to be paired into node LZC having a cardinality of 4383. Now, in accordance with block 114, the cardinality of node MZC is compared to node LZC and, since 5432, the cardinality of node MZC, is not less than 4383, a query is made at decision block 116 as to whether or not i+1 is equal to m. In this case, the answer is true, such that, at block 117, node n (ZC) and node i+1 (L) are deleted, and a new parent N1i+1 is added, which has a cardinality of 8554. As this resulted from the pairing of the last two nodes, the procedure exits, and the cardinality 8554 is representative of the root of the resulting memory structure, as shown in Step 4.

Figures 3A, 3B:
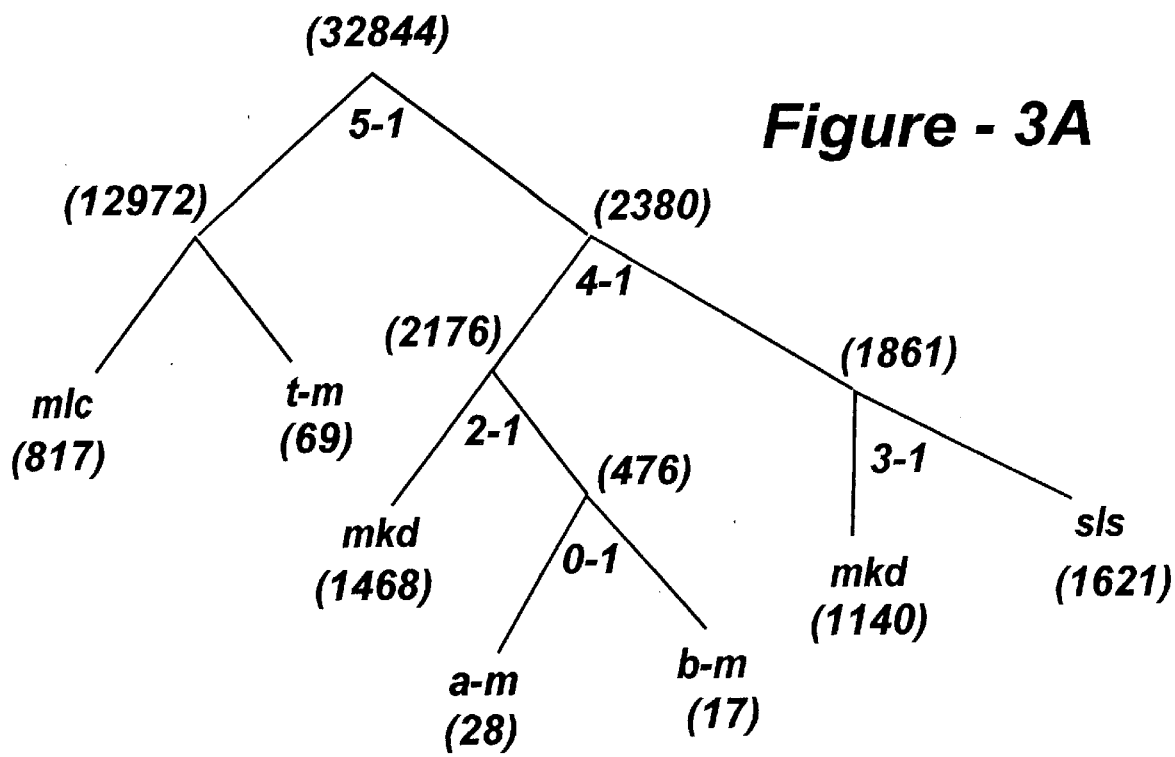
FIG. 3A is a memory structure utilizing seven fields and 32,844 records.
FIG. 3B is a list of the cardinalities associated with the structure of FIG. 3A, indicating where node replacement has taken place according to the invention.
Figures 4A, 4B:
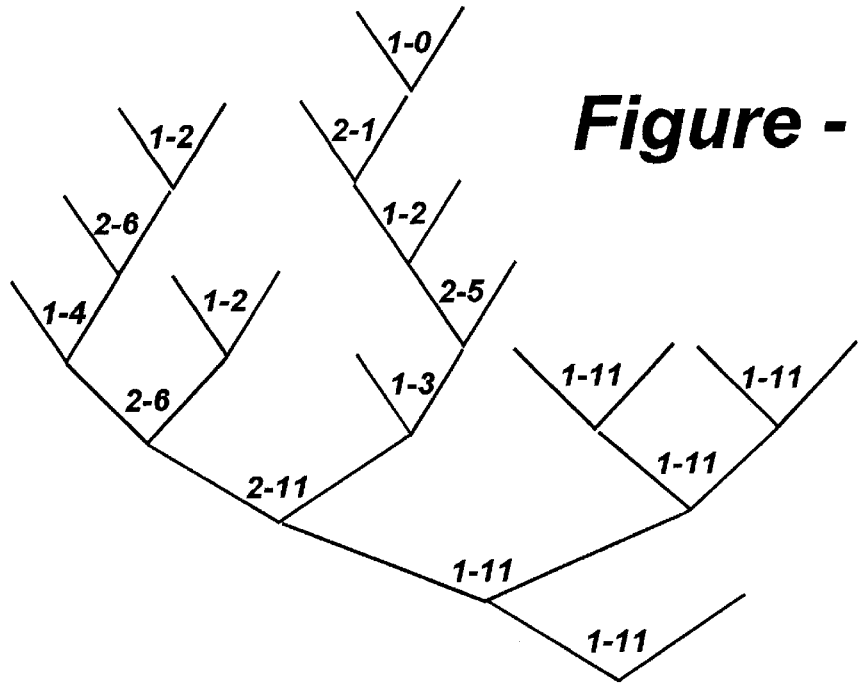
FIG. 4A is a is a memory structure utilizing seven fields and 32,844 records.
FIG. 4B is a list of the cardinalities associated with the structure of FIG. 4A, indicating where node replacement has taken place according to the invention.

Now making reference to FIG. 3, there is presented a somewhat more complex example involving seven fields and 32,844 records. Part A of the figure shows the memory structure resulting from the procedure depicted in the flowchart of FIG. 1. In part B of FIG. 3, the cardinalities associated with the pairing steps are shown, with a checkmark being used to show where a new parent node has been created as a result of the method. By following the procedure depicted in the flow diagram of FIG. 1, increasingly complex input streams may be accepted, as shown in Example 3 of FIG. 4.

Comparison To Huffman Coding

This invention is similar, in spirit, to Huffman coding, though there exist fundamental differences. First, Huffman coding works a single information source. That is the sum of cardinalities of all leaves is a constant while the sum of cardinalities of all single patterns or all single information sources is a variable. One symbol at a given time can only be one of the leaves in the case of single information source.

Second, with the Huffman coding for a single information source, all parent nodes have fixed probabilities once the two children's probabilities are known. The probability of a given node is simply the sum of those of the two children. Therefore, it is trivial to sort nodes in terms of probability since the parent node has static probability. On the other hand, the cardinality of a given non-leaf node in an N-gram memory structure is dynamic and can be anything between the maximum cardinally of the two children and the multiple of the cardinalities of the two children.

OPTIMALITY PROOF

A proper theory to explain the method is the theory for multiple information sources.

Given:

$$c\_i < c\_j \text{ or } c\_i - c\_j < 0,$$

and $$1\_i > 1\_j \text{ or } 1\_i - 1\_j > 0;$$

assume $$H = \ldots + c\_i 1\_i + \ldots + c\_j 1\_i + \ldots \text{ 1=minimum}$$

while $$H' = \ldots + c\_j 1\_j + \ldots + c\_j 1 i + \ldots = \text{minimum}$$

obtained by swapping i and j. Therefore, if the assumption above were true $$H' = <H \text{ or } H-H' > 0,$$

However, $$H - H' c\_i(1\_i - 1j) + c\_j(1\_j - 1\_i) = (1\_i - 1\_j)(c\_i - c\_j).$$

Since $1\_i - 1\_j > 0$ and $c\_i - c\_j < 0$ as given, we obtain $H-H' < 0$.

Hence, the assumption is wrong. $c\_i$ is the cardinality of ith node and $1\_i$ is the height of ith node. The height here means the level difference between the root node as level 0 and a node in a given level Since $c\_i$ is the total number of unique patterns at node i, $c\_i 1\_i$ is the total length to store $c\_i$ unique patterns in N-gram pattern representation or multiple information representation. Consequently, H is the total length to store all unique patterns, or all single and multiple information sources, in an N-gram memory structure, and it is the average height of the memory structure if unique patterns are normalized.

That claimed is:

1. A method of organizing a multi-level memory structure having an upper root end with lower nodes and branches representative of parallel data fields to be compressed, the method comprising the steps of:

eliminating the data fields at each lower branch or node, as the case may be, and replacing the parent node for that level with one of the lower branches or nodes in accordance with an optimality criterion; and repeating the above step until reaching the upper root end.

2. The method of claim 1, wherein the optimality criterion is entropy.

3. The method of claim 1, wherein the optimality criterion is based upon correlation coefficients.

4. The method of claim 1, wherein the optimality criterion is based upon mutual information.

5. The method of claim 1, wherein the optimality criterion is cardinality.

6. The method of claim 5, further including the step of ordering the data fields as a function of increasing cardinality prior to the step of replacing the data fields each time the step is performed.

7. The method of claim 1, wherein the multi-level memory structure is a binary tree structure, and wherein the data fields at each level are adjacent data fields.

8. A method of arranging an N-gram data structure to maximize the compression thereof, the method comprising the steps of:

(a) receiving a set of parallel data fields to be compressed;

(b) ordering the set as a function of increasing cardinality, if not already so ordered;

(c) comparing adjacent fields of lowest cardinality to create a new parent node;

(d) replacing the adjacent fields with the new parent node; and (e) repeating steps (b) through (d) until only a single node remains in the set.

9. The method of claim 8, wherein step (c) further includes that steps of:

(i) pairing the nodes of lowest cardinality;

(ii) pairing the result of (i) with the node of next greater cardinality;

(iii) comparing the results of(i) and (ii); and (iv) discontinue the process if the result of (i) has less cardinality than that of (ii), otherwise, retain the result of (ii).

10. A method of arranging an N-gram data structure to maximize the compression thereof, the method comprising the steps of:

(a) inputting m leaf nodes;

(b) sorting the nodes in terms of increasing cardinality as follows:

Cn1<Cn2< ... <Cnm where Cn1 is the cardinality of node n−1;

(c) pairing nodes n1 and ni to create a new parent node Ni;

(d) exiting if i=m; otherwise:

(e) comparing the cardinality of node N1i with that of ni+1 and, if the cardinality of node Ni is less than the cardinality of node ni+1:

(i) deleting nodes n1 and ni, (ii) adding node N1i to the structure, and (iii) decrementing m, and exiting if m <2; otherwise:

(iv) returning to step (b), above; otherwise:

(f) pairing nodes n1 and ni+1 to create a new parent node N1i+1;

(g) comparing the cardinality of node N1i with that of Ni+1 and, if the cardinality of node N1i is less than the cardinality of node Ni+1, repeating steps (i) to (iii) above; otherwise:

(h) if i+1 is equal to m:

(v) deleting nodes n1 and ni+1, (vi) adding node N1i+1 to the structure, and (vii) returning to step (iii), above; otherwise:

(i) comparing the cardinality of node N1i+1 with that of ni+2 and, if the cardinality of node N1i+1 is less than the cardinality of node ni+2, repeating steps (v) to (vii) above, otherwise:

(j) setting i=i+1 and returning to step (f), above.

* * * * *